US012763295B2

(12) United States Patent
Ishikawa et al.

(10) Patent No.: US 12,763,295 B2
(45) Date of Patent: Oct. 13, 2026

(54) PLASMA PROCESSING APPARATUS

(71) Applicant: Tokyo Electron Limited, Tokyo (JP)

(72) Inventors: Shinya Ishikawa, Miyagi (JP); Daiki Hariu, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 839 days.

(21) Appl. No.: 17/946,037

(22) Filed: Sep. 16, 2022

(65) Prior Publication Data

US 2023/0087660 A1 Mar. 23, 2023

(30) Foreign Application Priority Data

Sep. 17, 2021 (JP) ................................ 2021-152377
Aug. 1, 2022 (JP) ................................ 2022-122723

(51) Int. Cl.
*H01J 37/32* (2006.01)
*H10P 72/72* (2026.01)

(52) U.S. Cl.
CPC .. *H01J 37/32724* (2013.01); *H01J 37/32082* (2013.01); *H01J 37/32642* (2013.01); *H10P 72/722* (2026.01)

(58) Field of Classification Search
CPC ............ H01L 21/6833; H01J 37/32724; H01J 37/32082; H01J 37/32642; H01J 2237/332–3348
USPC ..... 156/345.51, 345.1–345.55; 118/715–733
See application file for complete search history.

(56) References Cited

U.S. PATENT DOCUMENTS

| | | | | |
|---|---|---|---|---|
| 6,267,839 | B1 * | 7/2001 | Shamouilian | B23Q 3/154 118/728 |
| 6,483,690 | B1 * | 11/2002 | Nakajima | H01L 21/6833 361/234 |
| 11,848,224 | B2 * | 12/2023 | Koizumi | H10P 72/722 |
| 12,183,601 | B2 * | 12/2024 | Kawanabe | H10P 72/0432 |
| 2009/0314433 | A1 * | 12/2009 | Hoffman | H01L 21/6833 156/345.48 |
| 2013/0021717 | A1 * | 1/2013 | Singh | H01L 21/6831 361/234 |
| 2015/0043123 | A1 * | 2/2015 | Cox | H01L 21/6833 29/611 |
| 2016/0111314 | A1 * | 4/2016 | Kimball | H01J 37/32715 438/758 |

(Continued)

FOREIGN PATENT DOCUMENTS

| | | |
|---|---|---|
| JP | 2014522103 A | 8/2014 |
| WO | 2013012612 A1 | 1/2013 |

*Primary Examiner* — Charlee J. C. Bennett
(74) *Attorney, Agent, or Firm* — XSENSUS LLP

(57) ABSTRACT

A plasma processing apparatus comprises a plasma processing chamber and a substrate support disposed in the plasma processing chamber. The substrate support includes a base, a ceramic member having a plurality of first vertical holes and a plurality of second vertical holes, at least one annular member, an electrostatic electrode layer, first and second central bias electrode layers, a plurality of first vertical connectors to surround the first vertical hole and to connect the first central bias electrode layer and the second central bias electrode layer, first and second annular bias electrode layers, a plurality of second vertical connectors to surround the second vertical hole and to connect the first annular bias electrode layer and the second annular bias electrode layer.

18 Claims, 7 Drawing Sheets

(56) References Cited

U.S. PATENT DOCUMENTS

| | | | | |
|---|---|---|---|---|
| 2016/0189994 | A1* | 6/2016 | Sasaki | H01L 21/67109 361/234 |
| 2017/0110356 | A1* | 4/2017 | Matyushkin | H01J 37/32577 |
| 2017/0117174 | A1* | 4/2017 | Weichart | H01L 21/6831 |
| 2017/0167790 | A1* | 6/2017 | Gaff | H05B 3/0014 |
| 2017/0170047 | A1* | 6/2017 | Nakamura | H01L 21/67109 |
| 2017/0352567 | A1* | 12/2017 | Cho | C23C 16/505 |
| 2017/0359859 | A1* | 12/2017 | Tosa | H01L 21/6831 |
| 2020/0173022 | A1* | 6/2020 | Han | C23C 16/4584 |
| 2020/0286717 | A1* | 9/2020 | Cho | H01J 37/32724 |
| 2020/0340102 | A1* | 10/2020 | Kimura | C23C 16/458 |
| 2023/0090650 | A1* | 3/2023 | Ishikawa | H01J 37/32724 156/345.34 |
| 2024/0038508 | A1* | 2/2024 | Lee | H01L 21/67103 |

* cited by examiner

PLASMA PROCESSING APPARATUS

CROSS-REFERENCE TO RELATED APPLICATIONS

This application claims priority to Japanese Patent Application Nos. 2021-152377 filed on Sep. 17, 2021 and 2022-122723 filed on Aug. 1, 2022, respectively, the entire contents of which are incorporated herein by reference.

TECHNICAL FIELD

The present disclosure relates to a plasma processing apparatus.

BACKGROUND

US Patent Unexamined Publication No. 2020/0286717 discloses a plasma processing chamber including an electrostatic chuck formed by stacking a cooling plate and a dielectric plate. A plurality of electrodes is disposed inside the electrostatic chuck disclosed in a specification of US Patent Unexamined Publication No. 2020/0286717.

SUMMARY

A technique according to the present disclosure appropriately suppresses occurrence of abnormal discharge inside a substrate support in processing plasma.

One aspect of the present disclosure provides a plasma processing apparatus comprising, a plasma processing chamber and a substrate support disposed in the plasma processing chamber. The substrate support includes a base, a ceramic member disposed on the base, and having a substrate support surface and a ring support surface, the ceramic member having a plurality of first vertical holes and a plurality of second vertical holes, each first vertical hole vertically extending downward from the substrate support surface, each second vertical hole vertically extending downward from the ring support surface, at least one annular member disposed on the ring support surface so as to surround a substrate on the substrate support surface, an electrostatic electrode layer embedded into the ceramic member and disposed below the substrate support surface, first and second central bias electrode layers embedded into the ceramic member and disposed below the electrostatic electrode layer, the second central bias electrode layer being disposed below the first central bias electrode layer, a plurality of first vertical connectors embedded into the ceramic member, and vertically extending in a vicinity of the first vertical hole so as to surround the first vertical hole in a plan view, each first vertical connector electrically connecting the first central bias electrode layer and the second central bias electrode layer, first and second annular bias electrode layers embedded into the ceramic member, and disposed below the ring support surface, the first annular bias electrode layer being electrically connected to the second central bias electrode layer, the second annular bias electrode layer being disposed below the first annular bias electrode layer; and a plurality of second vertical connectors embedded into the ceramic member, and vertically extending in a vicinity of the second vertical hole so as to surround the second vertical hole in a plan view, each second vertical connector electrically connecting the first annular bias electrode layer and the second annular bias electrode layer. The plasma processing apparatus comprises a bias generator electrically connected to the second annular bias electrode layer and configured to generate a bias signal.

DETAILED DESCRIPTION

In the manufacturing process of the semiconductor device, the processing gas supplied in the chamber is excited to generate plasma, and a semiconductor substrate (hereinafter, just referred to as "substrate") supported by a substrate support is subjected to various plasma processing such as etching processing, film-forming processing, diffusion processing, etc. An electrostatic chuck adsorbing and holding the substrate on a mounting surface by coulomb force and an electrode to which bias power is supplied in plasma processing are provided in the substrate support, for example.

However, a through-hole for inserting a lifter pin for delivering the substrate or an edge ring between an external transfer mechanism and the mounting surface or a gas distribution space for supplying heat transfer gas to a back side of the substrate or the edge ring is formed inside the electrostatic chuck, for example. However, when the through-hole or the gas distribution space is formed inside the electrostatic chuck, in particular, when bias power having a low frequency and high power is supplied to the electrode, a potential difference is generated in a vertical direction (thickness direction) of the electrostatic chuck, which may cause occurrence of the abnormal discharge. In addition, when the abnormal discharge occurs inside the through-hole or the gas distribution space, a discharge mark is formed on a back side (holding surface) of the substrate held on the electrostatic chuck, causing a malfunction in a subsequent process.

Here, as one method for suppressing the occurrence of the abnormal discharge inside the electrostatic chuck, a situation in which as a thickness of a ceramic member constituting the electrostatic chuck is decreased, a distance between the electrode to which the bias power is supplied and the substrates held on the mounting surface is decreased is considered. When the thickness of the ceramic member is decreased, an electric field space inside the electrostatic chuck becomes small, and as a result, acceleration of ions invaded from a plasma processing space is suppressed, thereby suppressing the occurrence of the abnormal discharge.

Figure 1:
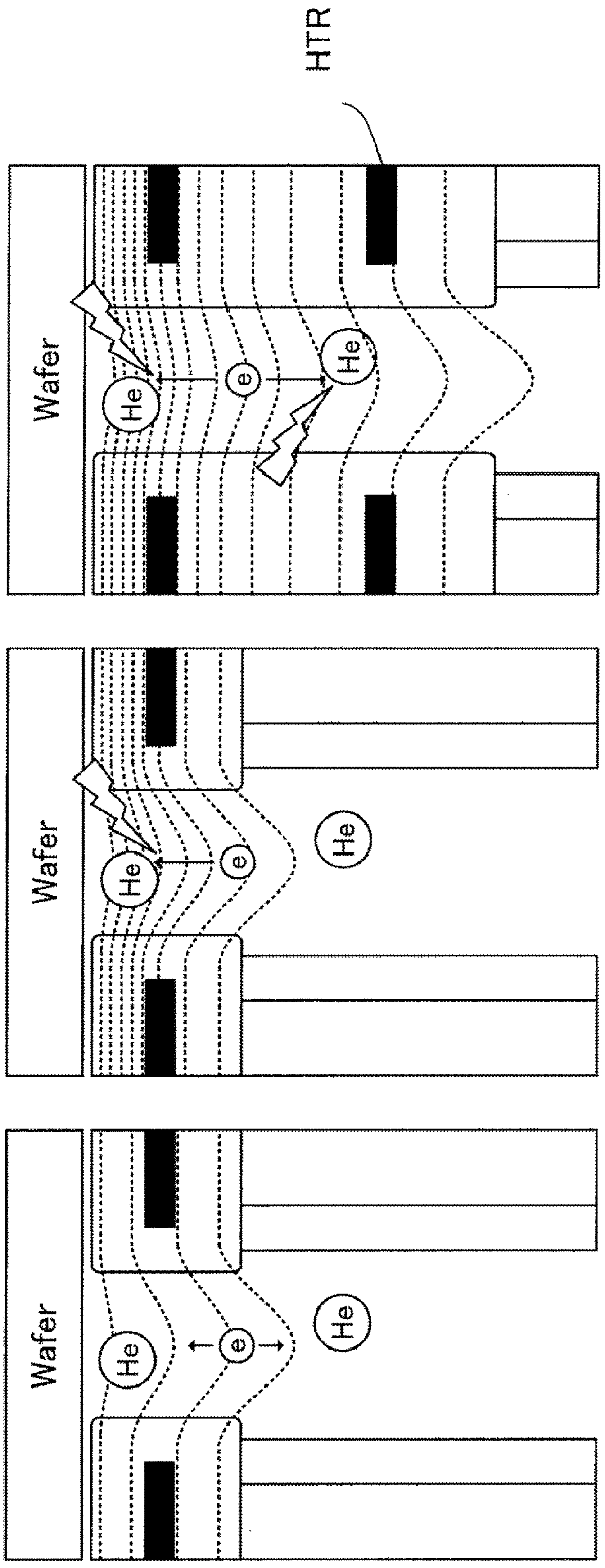
FIG. 1 is an explanatory diagram illustrating a shape of abnormal discharge inside an electrostatic chuck.

However, in recent plasma processing, a heating mechanism HTR (heater, etc.) is provided inside the electrostatic chuck as illustrated in a right diagram of FIG. 1, and controlling a temperature distribution of a substrate to be processed uniformly is required, and it is difficult to decrease the thickness of the electrostatic chuck with installation of the heating mechanism.

A technique according to the present disclosure, which is based on the circumstances, appropriately suppresses occurrence of abnormal discharge inside a substrate support in processing plasma. Hereinafter, a configuration of a substrate processing apparatus according to the exemplary embodiment will be described with reference to drawings. Further, in the present specification and drawings, the same reference numerals are given to elements having substantially the same functional configuration, so a redundant description will be omitted.

<Plasma Processing System>

Figure 2:
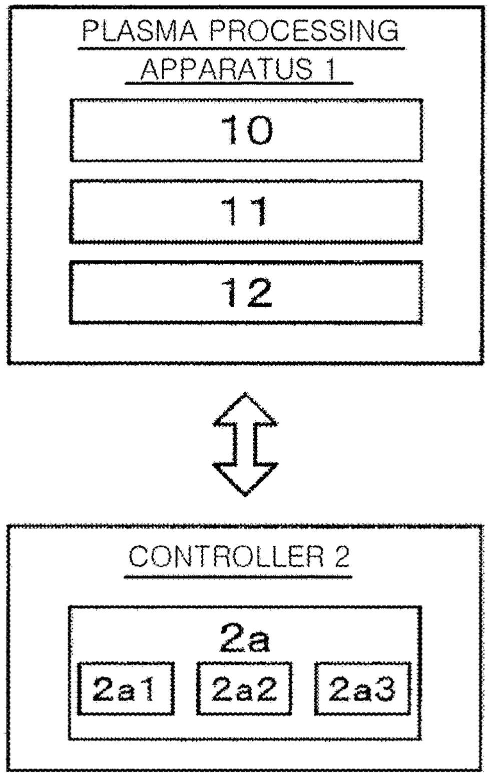
FIG. 2 is an explanatory diagram schematically illustrating a configuration of a plasma processing system according to the exemplary embodiment.

FIG. 2 is a diagram for describing a configuration example of a plasma processing system. In an exemplary embodiment, the plasma processing system includes a plasma processing apparatus 1 and a controller 2. The plasma processing system is an example of a substrate processing system and the plasma processing apparatus 1 is an example of a substrate processing apparatus. The plasma processing apparatus 1 includes a plasma processing chamber 10, a substrate support 11, and a plasma generator 12. The plasma processing chamber 10 has a plasma processing space. Further, the plasma processing chamber 10 includes at least one gas inlet for supplying at least one processing gas to the plasma processing space and at least one gas outlet for discharging gases from the plasma processing space. The gas inlet is connected to a gas supply 20 to be described below and the gas outlet is connected to an exhaust system 40 to be described below. The substrate support 11 is disposed in the plasma processing space, and has a substrate support surface for supporting a substrate.

The plasma generator 12 is configured to generate a plasma from at least one processing gas supplied in the plasma processing space. The plasma formed in the plasma processing space may be a capacitively coupled plasma (CCP), an inductively coupled plasma (ICP), an electron-cyclotron-resonance plasma (ECR plasma), a helicon wave plasma (HWP), or a surface plasma (SWP). Further, various types of plasma generators may be used, which include an alternating current (AC) plasma generator and a direct current (DC) plasma generator. In an exemplary embodiment, an AC signal (AC power) used in the AC plasma generator has a frequency in a range of 100 kHz to 10 GHz. Therefore, the AC signal includes a radio frequency (RF) signal and a microwave signal. In an exemplary embodiment, the RF signal has a frequency in a range of 100 kHz to 150 MHz.

The controller 2 processes a computer executable command which allows the plasma processing apparatus 1 to execute various processes described in the present disclosure. The controller 2 may be configured to control each element of the plasma processing apparatus 1 so as to execute various processes described herein. In an exemplary embodiment, a part or the entirety of the controller 2 may be included in the plasma processing apparatus 1. The controller 2 may include, for example, a computer 2*a*. The computer 2*a* may include a central processing unit (CPU) 2*a*1, a memory 2*a*2, and a communication interface 2*a*3, for example. The processor 2*a*1 may be configured to perform various control operations by reading a program from the storage 2*a*2 and executing the read program. The program may be stored in the storage 2*a*2 in advance or obtained through a medium as necessary. The obtained program is stored in the storage 2*a*2, and read and executed from the storage 2*a*2 by the processor 2*a*1. The medium may be various storage media readable by the computer 2*a* or a communication line connected to the communication interface 2*a*3. The storage 2*a*2 may include a random access memory (RAM), a read only memory (ROM), a hard disk drive (HDD), a solid state drive (SSD), or a combination thereof. The communication interface 2*a*3 may communicate with the plasma processing apparatus 1 through a communication line such as local area network (LAN), etc.

<Plasma Processing Apparatus>

Figure 3:
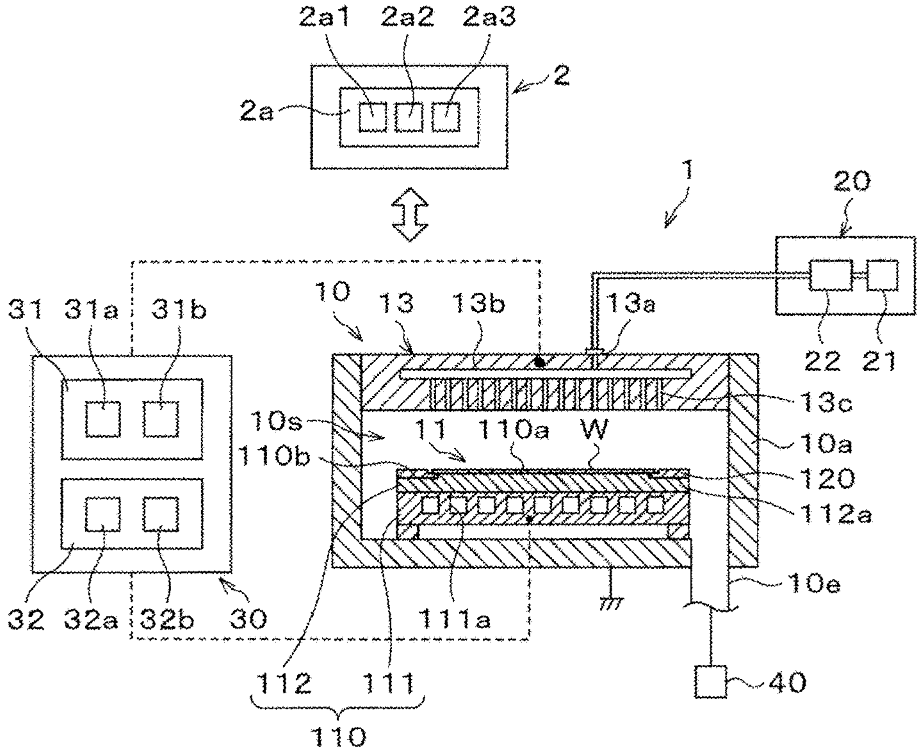
FIG. 3 is a cross-sectional view illustrating an example of a configuration of a plasma processing apparatus according to the exemplary embodiment.

Next, as an example of the plasma processing apparatus 1, an example of a configuration of a capacitively coupled plasma processing apparatus will be described. FIG. 3 is a diagram for describing a configuration example of a capacitively coupled plasma processing apparatus.

The capacitively coupled plasma processing apparatus 1 includes a plasma processing chamber 10, a gas supply 20, a power supply 30, and an exhaust system 40. Further, the plasma processing apparatus 1 includes a substrate support 11 and a gas introduction unit. The gas introduction unit is configured to introduce at least one processing gas into the plasma processing chamber 10. The gas introduction unit includes a showerhead 13. The substrate support 11 is disposed in the plasma processing chamber 10. The showerhead 13 is disposed above the substrate support 11. In an exemplary embodiment, the showerhead 13 constitutes at least a part of a ceiling of the plasma processing chamber 10. The plasma processing chamber 10 includes the showerhead 13, a sidewall 10*a* of the plasma processing chamber 10, and a plasma processing space 10*s* defined by the substrate support 11. The plasma processing chamber 10 is grounded. The showerhead 13 and the substrate support 11 are electrically insulated from a housing of the plasma processing chamber 10.

The substrate support 11 includes a body 110, a ring assembly 120, and a lifter (not illustrated). The body 110 has a central area 110*a* for supporting the substrate W and an annular area 110*b* for supporting the ring assembly 120. A wafer is an example of the substrate W. The annular area 110*b* of the body 110 surrounds the central area 110*a* of the body 110 in a plan view. The substrate W is disposed on the central area 110*a* of the body 110, and the ring assembly 120 is disposed on the annular area 110*b* of the body 110 to surround the substrate W on the central area 110*a* of the body 110. Therefore, the central area 110*a* is also called substrate support surface for supporting the substrate W, and the annular area 111*b* is also called ring support surface for supporting the ring assembly 120.

Further, in an exemplary embodiment, the body 110 includes a base 111 and an electrostatic chuck 112. The base 111 includes a conductive member. The conductive member of the base 111 may serve as a lower electrode. The electrostatic chuck 112 is disposed on the base 111. The electrostatic chuck 112 includes a ceramic member 112*a*, a plurality of electrodes disposed in the ceramic member 112*a*, and a gas distribution space formed in the ceramic member 112*a*. The plurality of electrodes includes one or more electrostatic electrodes (also referred to as chuck electrode) 115 and one or more bias electrodes 116 which may serve as the lower electrode. The plurality of electrodes disposed in the ceramic member 112*a* includes an electrostatic electrode to be described below, which is used for adsorbing and holding the substrate W, a bias electrode to be described below, which may serve as the lower electrode, a heater electrode to be described below, etc. The ceramic member 112*a* has the central area 110*a*. In an exemplary embodiment, the ceramic member 112*a* has also the annular area 111*b*. Further, another member surrounding the electrostatic chuck 112, such as an annular electrostatic chuck or an annular insulating member may have the annular area 110*b*. In this case, the ring assembly 120 may be disposed on the annular electrostatic chuck or the annular insulating member or disposed on both the electrostatic chuck 112 and the annular insulating member.

The ring assembly 120 includes one or more annular members. In an exemplary embodiment, one or more annular members includes one or more edge rings and at least one cover ring. The edge ring is made of a conductive material or an insulating material, and the cover ring is made of the insulating material.

The lifter (not illustrated) performs the delivery of the substrate W to and from a transfer mechanism (not illustrated) on the central area 110*a* (substrate support surface). The lifter includes a substrate lifter pin (not illustrated). The substrate lifter pin is inserted into the through hole 112*b* to be described below, which is formed by penetrating the electrostatic chuck 112 in the thickness direction from the substrate support surface, and is configured to protrude from an upper surface of the substrate support surface through the through hole 112*b*. Therefore, the substrate lifter pin moves (lifts up) the substrate W in the vertical direction by supporting a lower surface of the substrate W supported on the upper surface of the central area 110*a* (substrate support surface).

Further, the lifter performs the delivery of the ring assembly 120 to and from the transfer mechanism not illustrated on the annular area 110*b* (ring support surface). The lifter includes a ring lifter pin (not illustrated). The ring lifter pin for the substrate is inserted into a through hole 112*c* to be described below, which is formed by penetrating the electrostatic chuck 112 in the thickness direction from the ring support surface, and is configured to protrude from the upper surface of the ring support surface through the through hole 112*c*. Therefore, the ring lifter pin moves (lifts up) the ring assembly 120 in the vertical direction by supporting the lower surface of the ring assembly 120 supported on the upper surface of the annular area 110*b* (ring support surface).

Further, the substrate support 11 may include a temperature control module configured to control at least one of the electrostatic chuck 112, the ring assembly 120, and the substrate W at a target temperature. As illustrated in FIG. 3, in an exemplary embodiment, the temperature control module includes a heater electrode to be described below, which is disposed inside the electrostatic chuck 112 and a fluid channel 111*a* formed inside the base 111. In the fluid channel 111*a*, a heat transfer fluid such as brine or gas flows. Further, a configuration of the temperature control module is not limited thereto, and the temperature control module may be configured to control a temperature of at least one of the electrostatic chuck 112, the ring assembly 120, and the substrate W.

Further, the inside of the substrate support 11 may include a heat transfer gas supply configured to supply a heat transfer gas between the back side of the substrate W and the central area 110*a* or between the back side of the ring assembly 120 and the annular area 110*b*.

Further, a detailed configuration of the substrate support 11 included in the plasma processing apparatus 1 according to the technique of the present disclosure will be described below.

The showerhead 13 is configured to introduce at least one processing gas from the gas supply 20 into the plasma processing space 10*s*. The showerhead 13 has at least one gas inlet 13*a*, at least one gas diffusion space 13*b*, and a plurality of gas introduction ports 13*c*. The processing gas supplied to the gas inlet 13*a* is introduced into the plasma processing space 10*s* from the plurality of gas introduction ports 13*c* through the gas diffusion space 13*b*. Further, the showerhead 13 includes an upper electrode. Further, the gas introduction unit may include one or more side gas injectors (SGI) mounted on one or more openings formed on the sidewall 10*a* in addition to the showerhead 13.

The gas supply 20 may include at least one gas source 21 and at least one flow controllers 22. In an exemplary embodiment, the gas supply 20 is configured to supply at least one processing gas to the showerhead 13 from the gas source 21 corresponding to the gas supply 20 through the flow controller 22 corresponding thereto, respectively. Each flow controller 22 may include, for example, a mass flow controller or a pressure control type flow controller. Further, the gas supply 20 may include at least one flow modulation device which modulates or pulses the flow of at least one processing gas.

The power supply 30 includes an RF power supply 31 coupled to the plasma processing chamber 10 through at least one impedance matching circuit. The RF power supply 31 is configured to supply at least one RF signal (RF power) such as a source RF signal and a bias RF signal to the lower electrode and/or the upper electrode. Therefore, a plasma is formed from at least one processing gas supplied to the plasma processing space 10*s*. Therefore, the RF power supply 31 may serve as at least a part of the plasma generator 12. Further, by supplying the bias RF signal to the lower electrode, a bias potential may be generated on the substrate W and ion components in the formed plasma may be attracted to the substrate W.

In an exemplary embodiment, the RF power supply 31 includes a first RF generator 31*a* and a second RF generator 31*b*. The first RF generator 31*a* is configured to be coupled to the lower electrode and/or the upper electrode through at least one impedance matching circuit, and to generate a source RF signal (source RF power) for plasma generation. In an exemplary embodiment, the source RF signal has a frequency in a range of 10 to 150 MHz. In an exemplary embodiment, the first BF generator 31*a* may be configured to generate a plurality of source RF signals having different frequencies. One or more source RF signals generated are supplied to the lower electrode and/or the upper electrode.

The second RF generator 31*b* is configured to be coupled to the lower electrode through at least one impedance matching circuit, and to generate the bias RF signal (bias RF power). A frequency of the bias RF signal may be the same as or different from the frequency of the source RF signal. In an exemplary embodiment, the bias RF signal has a lower frequency than the source RF signal. In an exemplary embodiment, the bias RF signal has 1.2 MHz or less, more preferably, a frequency in a range of 100 kHz to 500 kHz. In an exemplary embodiment, the second RF generator 31*b* may be configured to generate a plurality of bias RF signals having different frequencies. One or more bias RF signals generated are supplied to the lower electrode. Further, in various exemplary embodiments, at least one of the source RF signal and the bias RF signal may be pulsed.

Further, the power supply 30 may include the DC power supply 32 coupled to the plasma processing chamber 10. The DC power supply 32 includes a first DC generator 32*a* and a second DC generator 32*b*. In an exemplary embodiment, the first DC generator 32*a* is configured to be connected to the lower electrode and generate a first DC signal. The generated first DC signal is applied to the lower electrode. In an exemplary embodiment, the second DC generator 32*b* is configured to be connected to the upper electrode and generate a second DC signal. The generated second DC signal is applied to the upper electrode.

In various exemplary embodiments, the first and second DC signals may be pulsed. In this case, a sequence of DC-based voltage pulses is applied to the lower electrode and/or the upper electrode. In this case, the pulsed first and second DC signals may also be used as a bias DC signal (bias DC power). The voltage pulse may have a pulse waveform of a rectangle, a trapezoid, a triangle, or a combination thereof. In an exemplary embodiment, a waveform generator for generating the sequence of the voltage sequence from the DC signal is connected between the first DC generator 32*a* and the lower electrode. Therefore, the first DC generator 32*a* and the waveform generator constitute a voltage pulse generator. When the second DC generator 32*b* and the waveform generator constitute the voltage pulse generator, the voltage pulse generator is connected to the upper electrode. The voltage pulse may have a positive polarity or a negative polarity. Further, the sequence of the voltage pulse may include one or more voltage positive voltage pulses and one or more negative voltage pulses within one cycle. Further, the first and second DC generators 32*a* and 32*b* may be provided in addition to the RF power supply 31 or the first DC generator 32*a* may be provided instead of the second RF generator 31*b*.

The exhaust system 40 may be connected to a gas outlet 10*e* provided on a bottom of the plasma processing chamber 10, for example. The exhaust system 40 may include a pressure adjustment valve and a vacuum pump. By the pressure adjustment valve, pressure in the plasma processing space 10*s* is adjusted. The vacuum pump may include a turbo molecule pump, a dry pump, or a combination thereof.

<Substrate Support>

Next, a detailed configuration example of the substrate support 11 will be described.

As described above, the substrate support 11 includes the body 110 and the ring assembly 120, and the body 110 includes the base 111 and the electrostatic chuck 112. Further, the electrostatic chuck 112 has the central area 110*a* for supporting the substrate W and the annular area 110*b* for supporting the ring assembly 120 on the upper surface.

Figure 4:
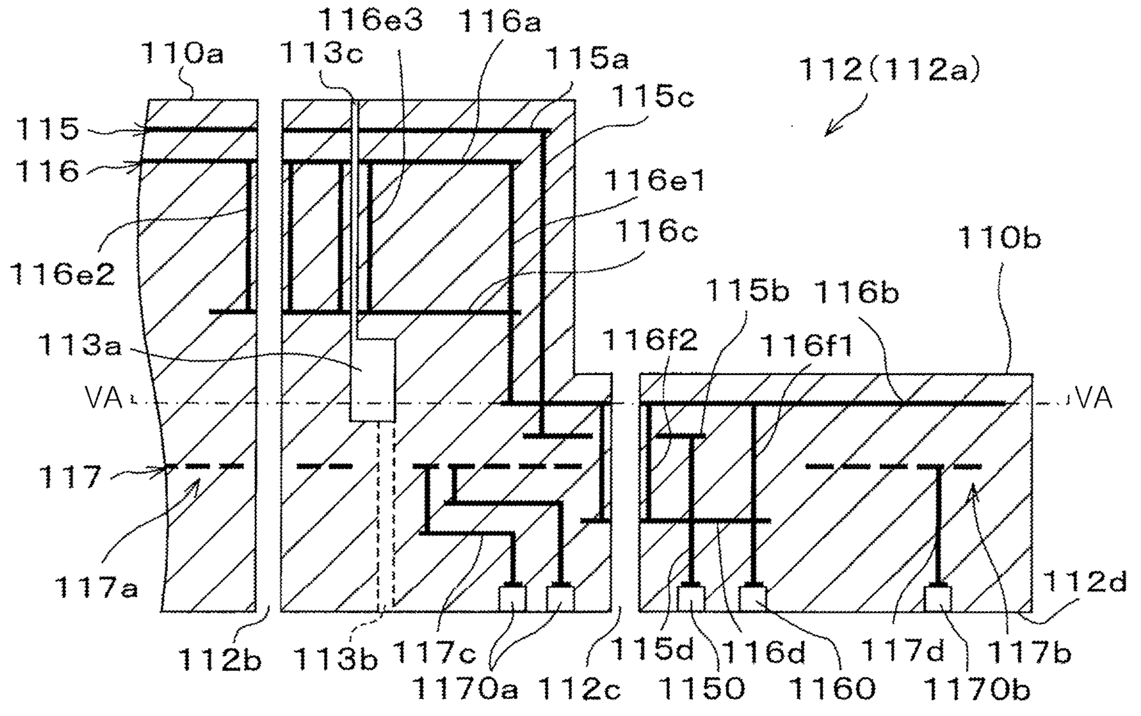
FIG. 4 is a cross-sectional view schematically illustrating a configuration of an electrostatic chuck constituting a substrate support.
Figure 5A:
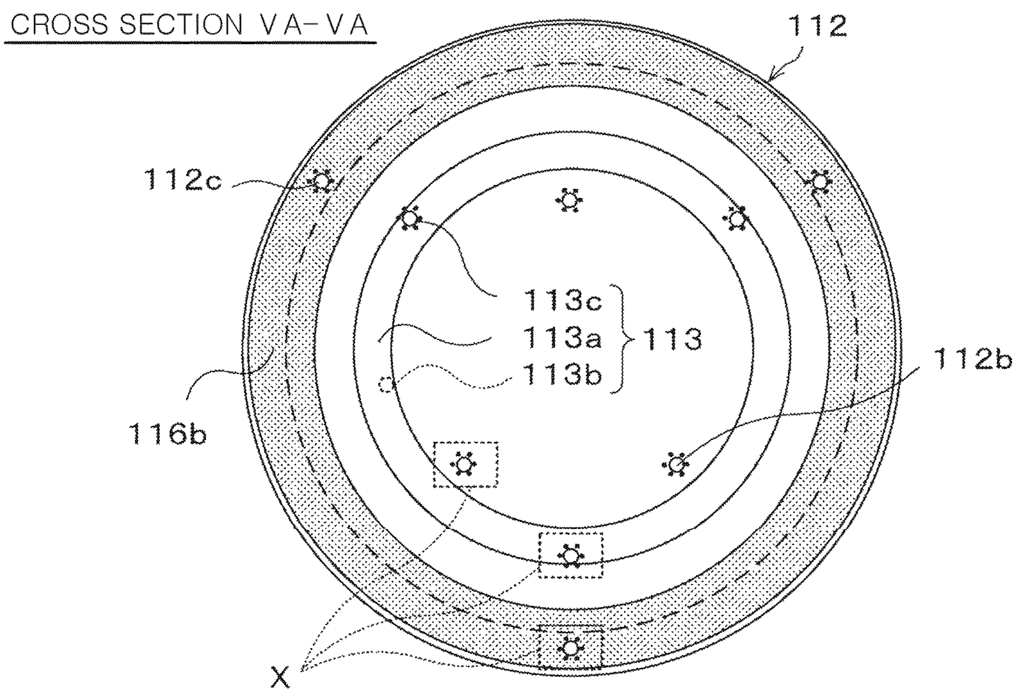
FIG. 5A is a cross-sectional view of FIG. 4.

FIG. 4 is a cross-sectional view schematically illustrating the configuration of the electrostatic chuck 112. In FIG. 4, the base 111 disposed to be stacked jointly with the electrostatic chuck 112, and the substrate W and the ring assembly 120 supported on the electrostatic chuck 112 are not illustrated. Further, FIG. 5A is a transverse cross-sectional view illustrating cross section VA-VA illustrated in FIG. 4.

The electrostatic chuck 112 is disposed on the base 111 as described above. The electrostatic chuck 112 includes a ceramic member 112*a* having at least one ceramic layer. The ceramic member 112*a* has the central area 110*a* on the upper surface. In an exemplary embodiment, the ceramic member 112*a* has also the annular area 111*b* on the upper surface.

Further, the ceramic member 112*a* has a first thickness at a portion corresponding to the central area 110*a* and a second thickness smaller than the first thickness at a portion corresponding to the annular area 110*b*. In other words, the ceramic member 112*a* has a cross-sectional shape having an approximately convex shape in which the substrate support surface (central area 11*a*) is higher than a ring support surface (annular area 110*b*) and a convex portion is formed on the upper surface as illustrated in FIG. 4.

The ceramic member 112*a* of the electrostatic chuck 112 has a plurality of through holes penetrating from the substrate support surface in the vertical direction (thickness direction), i.e., three through holes 112*b* in the exemplary embodiment, and a plurality of through holes penetrating from the ring support surface in the vertical direction, i.e., three through holes 112*c* in the exemplary embodiment.

The through hole 112*b* is formed to penetrate from the substrate support surface of the ceramic member 112*a* to a lower surface 112*d* in the vertical direction. The substrate lifter pin is embedded into the through hole 112*b*. As illustrated in FIG. 5A, a plurality of through holes 112*b*, i.e., three through holes 112*b* in the exemplary embodiment are formed in response to the number of substrate lifter pins.

The through hole 112*c* is formed to penetrate from the ring support surface of the ceramic member 112*a* to the lower surface 112*d* in the vertical direction. The ring lifter pin is embedded into the through hole 112*c*. As illustrated in FIG. 5A, a plurality of through holes 112*c*, i.e., three through holes 112*c* in the exemplary embodiment, are formed in response to the number of ring lifter pins.

Further, the heat transfer gas supply 113 is formed in the ceramic member 112*a* of the electrostatic chuck 112. The heat transfer gas supply 113 supplies heat transfer gas (back side gas: e.g., He gas) between the back side of the substrate W and the central area 110*a* (substrate support surface).

As illustrated in FIG. 4, the heat transfer gas supply 113 has a distribution space 113*a*, a gas inlet 113*b* for supplying the heat transfer gas to the distribution space 113*a*, and a gas outlet 113*c* for discharging the heat transfer gas from the distribution space 113*a*.

The distribution space 113*a* is formed in an approximately ring shape in a circumferential direction of the ceramic member 112*a* on the plan view as illustrated in FIG. 5A. The distribution space 113*a* need not particularly be configured by consecutive rings as illustrated in FIG. 5A, and a part thereof may be configured by inconsecutive rings. Specifically, for example, the distribution space 113*a* may have an approximately C shape on the plan view.

As illustrated in FIG. 5A, the gas inlet 113*b* (see FIG. 4) which extends from the lower surface 112*d* of the ceramic member 112*a* in the vertical direction is connected to an inner area inside a diameter direction of the distribution space 113*a*. The gas inlet 113*b* is connected to a heat transfer gas supply source (not illustrated).

Further, as illustrated in FIG. 5A, the gas outlet 113*c* (see FIG. 4) which extends from the upper surface (substrate support surface) of the ceramic member 112*a* in the vertical direction is connected to an outer area outside the diameter direction of the distribution space 113*a*. A plurality of (three in the illustrated example) gas outlets 113*c* are arranged in the circumferential direction of the central area 110*a* (substrate support surface) approximately uniformly.

That is, the heat transfer gas from the heat transfer gas supply source (not illustrated) is supplied to the distribution space 113*a* through the gas inlet 113*b*, distributed in the circumferential direction of the ceramic member 112*a* in the corresponding distribution space 113*a*, and then supplied toward the back side of the substrate W through the gas outlet 113*c*.

Further, the electrostatic electrode 115, the bias electrode 116, and the heater electrode 117 are provided inside the ceramic member 112*a* of the electrostatic chuck 112. The electrostatic electrode is an example of a clamp electrode. The electrostatic chuck 112 is configured by fitting the electrostatic electrode 115, the bias electrode 116, and the heater electrode 117 between the ceramic member 112*a* (e.g., a pair of dielectric films made of a non-magnetic dielectric such as ceramics) with the through holes 112*b* and 112*c*, and the heat transfer gas supply 113.

The electrostatic electrode 115 is electrically connected to an electrostatic adsorption DC power supply (not illustrated) through a terminal 1150 provided on the lower surface 112*d* of the ceramic member 112*a*. In addition, electrostatic force such as coulomb force is generated by applying DC voltage (DC signal) to the electrostatic electrode 115 from the electrostatic adsorption DC power supply, and the substrate W is adsorbed and held on the central area 110*a* by the generated electrostatic force.

The electrostatic electrode 115 is provided inside the convex portion below the central area 110*a*, and includes an approximately disk-shaped first electrostatic electrode 115*a* for adsorbing and holding the substrate W on the central area 110*a*. Further, the electrostatic electrode 115 is disposed below the annular area 110*b* in the thickness direction of the ceramic member 112*a*, and includes an adsorption annular driver 115*b* disposed to overlap with both the first electrostatic electrode 115*a* and the annular area 110*b* in the vertical direction.

The first electrostatic electrode 115*a* is electrically connected to the conductive electrostatic adsorption annular driver 115*b* through one or more conductive vias 115*c* which are approximately uniformly arranged in the circumferential direction. Further, the electrostatic adsorption annular driver 115*b* is electrically connected to the terminal 1150 via one or more conductive vias 115*d* which are approximately uniformly arranged in the circumferential direction. In other words, the first electrostatic electrode 115*a* is offset outside the diameter direction by the adsorption annular driver 115*b* inside the ceramic member 112*a*, and then connected to the terminal 1150. The electrostatic adsorption DC power supply is electrically connected to the terminal 1150.

Further, as the electrostatic adsorption DC power supply, the power supply 30 illustrated in FIG. 3 may be used and the electrostatic adsorption DC power supply (not illustrated) independent from the power supply 30 may be used.

The bias electrode 116 is electrically connected to the power supply 30 through a terminal 1160 provided on the lower surface 112*d* of the ceramic member 112*a*. The bias electrode 116 includes an approximately disk-shaped first bias electrode 116*a* serving as the lower electrode and an approximately annular second bias electrode 116*b*, and generates a bias potential in the substrate W by supplying the bias signal from the power supply 30 to attract ion components in the plasma to the substrate W. Further, both the conductive member of the base 111 and the bias electrode 116 may serve as the lower electrode.

The first bias electrode 116*a* is provided inside the convex portion below the central area 110*a*, and primarily attracts the ion components to a central portion of the substrate W. Further, at least a part of the second bias electrode 116*b* is provided below the annular area 110*b*, and primarily attracts the ion components to an outer peripheral portion of the substrate W.

Further, the bias electrode 116 includes a first relay member 116*c* as a conductive member disposed below the first bias electrode 116*a* and a second relay member 116*d* as an annular conductive member disposed below the second bias electrode 116*b*. In an exemplary embodiment, the first relay member 116*c* is a circular bias electrode layer.

The first bias electrode 116*a* and the first relay member 116*c* are electrically connected via a first conductive via 116*e*. The conductive via as a conductive wire which extends in the vertical direction in the ceramic member 112*a* is also called a vertical connector or a via connector. As illustrated in FIG. 4, the first conductive via 116*e* includes one or more first conductive vias 116*e*1 arranged approximately uniformly in the circumferential direction outside the diameter direction of the first bias electrode 116*a* and the first relay member 116*c*, one or more first conductive vias 116*e*2 arranged along a peripheral surface of the through hole 112*b*, and one or more first conductive vias 116*e*3 arranged on the peripheral surface of the gas outlet 113*c* of the heat transfer gas supply 113.

The first conductive via 116*e*1 vertically extends downward from the outside of the diameter direction of the first bias electrode 116*a*, and is connected to the first relay member 116*c*, and then further extends downward and is connected to the second bias electrode 116*b*. In other words, the first conductive via 116*e*1 electrically connects the first bias electrode 116*a* and the second bias electrode 116*b*.

Figure 5B:
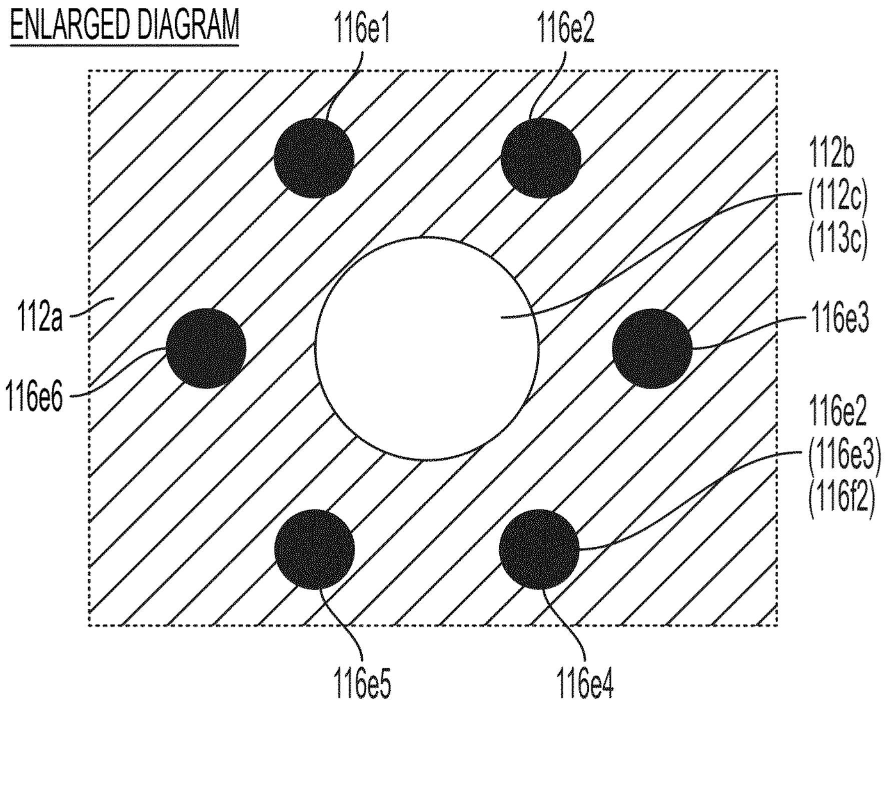
FIG. 5B is an enlarged diagram of a key part of FIG. 5A.

The first conductive vias 116*e*2 vertically extend along the peripheral surface of the through hole 112*b* through which the lifter pin is embedded, and further, one or more first conductive vias 116*e*2 (six for one through hole 112*b* in the example illustrated in FIG. 5B) are arranged to surround the periphery of the through hole 112*b* approximately uniformly. The first conductive via 116*e*2 forms a space having an equivalent potential to an area surrounded by the first conductive via 116*e*2, i.e., the inside of the through hole 112*b*, by supplying the bias signal, thereby suppressing a potential difference in the thickness direction of the ceramic member 112*a*.

Further, the first conductive via 116*e*2 is preferably disposed to be at least spaced apart from the peripheral surface of the through hole 112*b* by 2 mm or more in order to secure an internal pressure to and from the through hole 112*b*. In other words, it is preferable that a ceramic (ceramic member 112*a*) of at least 2 mm is interposed between the peripheral surface of the through hole 112*b* and the first conductive via 116*e*2. In an exemplary embodiment, a distance between the first conductive via 116*e*2 and the through hole 112*b* is 2 mm or more. In an exemplary embodiment, the distance between the first conductive via 116*e*2 and the through hole 112*b* is 2 to 5 mm.

Figure 6A:
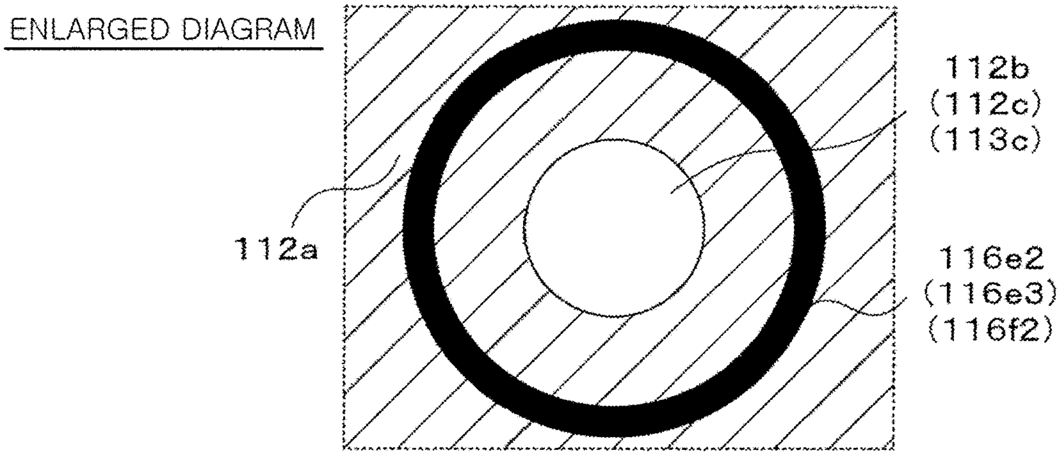
FIG. 6A is a cross-sectional view illustrating another configuration example of a conductive via.
Figure 6B:
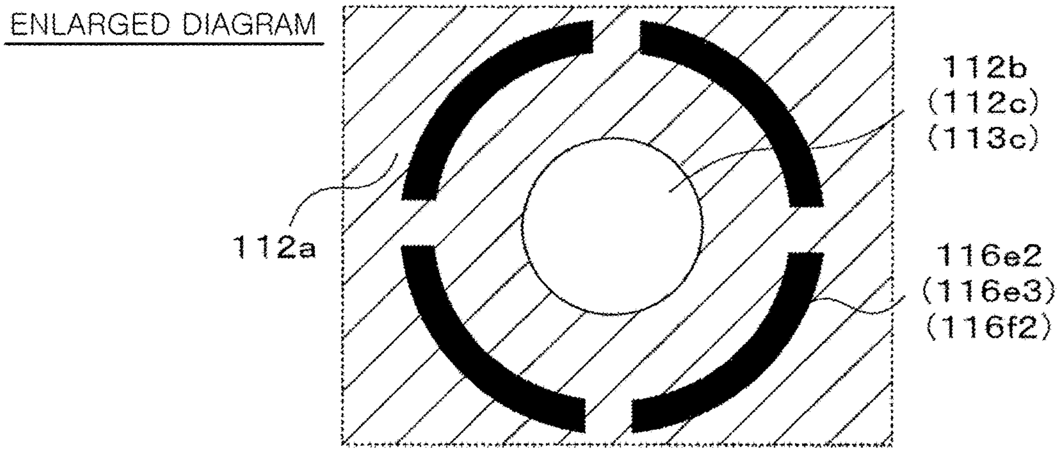
FIG. 6B is a cross-sectional view illustrating another configuration example of the conductive via.
Figure 6C:
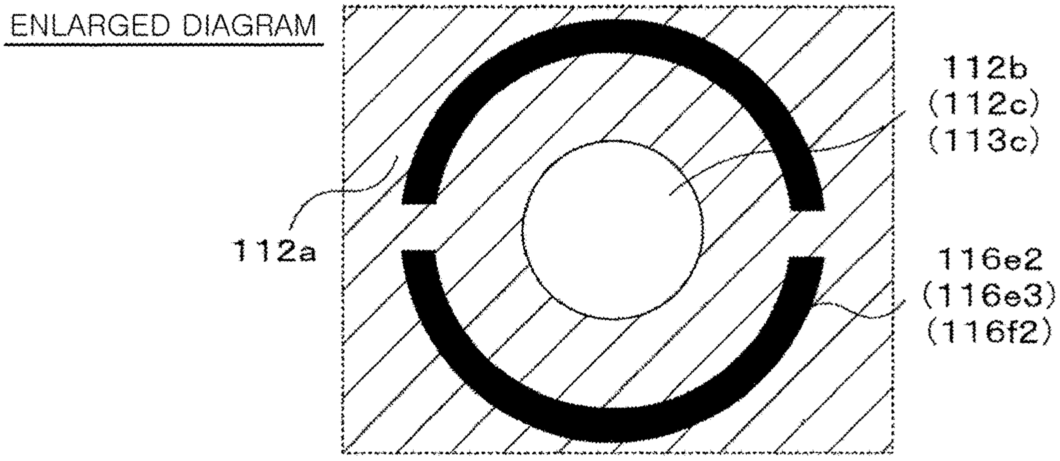
FIG. 6C is a cross-sectional view illustrating another configuration example of the conductive via.

Further, the first conductive via 116*e*2 may form a space having an equivalent potential in an area surrounded by the first conductive via 116*e*2, and the shape or the number is not limited. Specifically, for example, as illustrated in FIG. 5B, a plurality of wire-shaped first conductive vias 116*e*2, preferably, four or more may be arranged along the peripheral surface of the through hole 112*b*. Further, for example, as illustrated in FIG. 6A, one first conductive via 116*e*2 configured in an approximately cylindrical shape may be disposed so that the through hole 112*b* extends therein. Further, for example, as illustrated in FIG. 6B or 6C, a plurality of first conductive vias 116*e*2 having an approximately arc shape or an approximately semi-circular shape may be disposed along the peripheral surface of the through hole 112*b*.

The first conductive vias 116_e_3 vertically extend along the peripheral surface of the gas outlet 113_c_ through which the heat transfer gas is supplied, and further, one or more first conductive vias 116_e_3 (six for one gas outlet 113_c_ in the example illustrated in FIG. 5B) are arranged to surround the periphery of the gas outlet 113_c_ approximately uniformly. The first conductive via 116_e_3 forms a space having an equivalent potential to an area surrounded by the first conductive via 116_e_3, i.e., the inside of the gas outlet 113_c_, by supplying the bias signal, thereby suppressing the potential difference in the thickness direction of the ceramic member 112_a_.

Further, the first conductive via 116_e_3 is preferably disposed to be at least spaced apart from the peripheral surface of the gas outlet 113_c_ by 2 mm or more in order to secure the internal pressure to and from the gas outlet 113_c_. In other words, it is preferable that a ceramic (ceramic member 112_a_) of at least 2 mm is interposed between the peripheral surface of the gas outlet 113_c_ and the first conductive via 116_e_3. In an exemplary embodiment, a distance between the first conductive via 116_e_3 and the gas outlet 113_c_ is 2 mm or more. In an exemplary embodiment, the distance between the first conductive via 116_e_3 and the gas outlet 113_c_ is 2 to 5 mm.

Further, the first conductive via 116_e_3 may be disposed in a predetermined shape and in a predetermined number similarly to the first conductive via 116_e_2. That is, when the first conductive via 116_e_3 may form the space having the equivalent potential in the area surrounded by the first conductive via 116_e_3, the first conductive via 116_e_3 may have a predetermined shape and a predetermined number as illustrated in FIG. 5A or FIGS. 6A to 6C.

The first relay member 116_c_ and the second bias electrode 116_b_ are electrically connected via the first conductive via 116_e_1 as described above. Further, the second bias electrode 116_b_ is electrically connected to the second relay member 116_d_ via the second conductive via 116_f_. The second bias electrode 116_b_ and the second relay member 116_d_ are also called the annular bias electrode. The second conductive via 116_f_ has one or more second conductive vias 116_f_1 approximately uniformly arranged in the circumferential direction, which electrically connect the second bias electrode 116_b_ and the terminal 1160, and one or more second conductive vias 116_f_2 arranged on the peripheral surface of the through hole 112_c_ as illustrated in FIG. 4.

A plurality of second conductive vias 116_f_1 vertically extend downward from the second bias electrode 116_b_, and are connected to the second relay member 116_d_, and then further extend downward and connected to the terminal 1160. In other words, the second conductive via 116_f_1 electrically connects the second bias electrode 116_b_ and the terminal 1160. The power supply 30 is electrically connected to the terminal 1160.

The second conductive vias 116_f_2 vertically extend along the peripheral surface of the through hole 112_c_ through which the lifter pin is embedded, and further, one or more first conductive vias 116_e_2 (six for one through hole 112_c_ in the example illustrated in FIG. 5A) are arranged to surround the periphery of the through hole 112_c_ approximately uniformly. The second conductive via 116_f_2 forms a space having an equivalent potential to an area surrounded by the second conductive via 116_f_2, i.e., the inside of the through hole 112_c_, by supplying the bias signal, thereby suppressing the potential difference in the thickness direction of the ceramic member 112_a_.

Further, the second conductive via 116_f_2 is preferably disposed to be at least spaced apart from the peripheral surface of the through hole 112_c_ by 2 mm or more in order to secure the internal pressure to and from the through hole 112_c_. In other words, it is preferable that a ceramic (ceramic member 112_a_) of at least 2 mm is interposed between the peripheral surface of the through hole 112_c_ and the second conductive via 116_f_2.

Further, the second conductive via 116_f_2 may be disposed in a predetermined shape and in a predetermined number similarly to the first conductive via 116_e_2 or the first conductive via 116_e_3. That is, when the second conductive via 116_f_2 may form the space having the equivalent potential in the area surrounded by the second conductive via 116_f_2, the second conductive via 116_f_2 may have a predetermined shape and a predetermined number as illustrated in FIG. 5A or FIGS. 6A to 6C.

The heater electrode 117 is electrically connected to a heater power supply (not illustrated) through a terminal 1170 provided on the lower surface 112_d_ of the ceramic member 112_a_. In addition, the heater electrode 117 is heated by applying voltage to the heater electrode 117 from the heater power supply to control at least one of the electrostatic chuck 112, the ring assembly 120, and the substrate W at a target temperature.

The heater electrode 117 is provided below the central area 110_a_, and includes a first heater electrode group 117_a_ having an approximately disk shape for heating the substrate W supported on the central area 110_a_. Further, the heater electrode 117 is provided below the annular area 110_b_, and includes one or more annular second heater electrodes 117_b_ for heating the ring assembly 120 supported in the annular area 110_b_.

The first heater electrode group 117_a_ is configured in an approximately disk shape having a larger diameter than the convex portion of the ceramic member 112_a_. The first heater electrode group 117_a_ includes a plurality of first heater electrodes (not illustrated). Each of the plurality of first heater electrodes is connected to a terminal 1170_a_ via an independent conductive via 117_c_, and the heater power supply is electrically connected to the terminal 1170_a_. Therefore, supply of power to each first heater electrode is individually configured to be controllable. In other words, the first heater electrode group 117_a_ is configured to independently control a temperature of the central area 110_a_ (substrate W) for each of the plurality of first heater electrodes or for each of the plurality of temperature control areas defined by a combination on the plan view.

The second heater electrode 117_b_ is configured to control the temperature of the annular area 110_b_, and control the temperature of the ring assembly 120 supported on the annular area 110_b_ by controlling the temperature. The second heater electrode 117_b_ is connected to the terminal 1170_b_ via one or more conductive vias 117_d_. The heater power supply is electrically connected to the terminal 1170_b_. Further, the second heater electrode 117_b_ may be configured to control the temperature of the annular area 110_b_ independently for each of the plurality of temperature control areas similarly to the first heater electrode group 117_a_.

Further, as the heater power supply, the power supply 30 illustrated in FIG. 3 may be used and a heater power supply (not illustrated) independent from the power supply 30 may be used.

In an exemplary embodiment, the substrate support 11 includes an electrostatic electrode layer 115_a_, a first central bias electrode layer 116_a_, a second central bias electrode layer 116_c_, first annular bias electrode layer 116_b_, and a second annular bias electrode layer 116_d_. The electrode layers are embedded into the ceramic member 112_a_. The electrostatic electrode layer 115*a* is disposed below the substrate support surface 110*a*. The first and second central bias electrode layers 116*a* and 116*c* are disposed below the electrostatic electrode layer 115*a*. The second central bias electrode layer 116*c* is disposed below the first central bias electrode layer 116*a*. The first and second annular bias electrode layers 116*b* and 116*d* are disposed below the ring support surface 110*b*. The second annular bias electrode layer 116*d* is disposed below the first annular bias electrode layer 116*b*. In an exemplary embodiment, a distance between the second annular bias electrode layer 116*d* and the lower surface 112*d* of the ceramic member 112*a* is 1.5 mm or less.

Further, the substrate support 11 includes a plurality of first vertical connectors 116*e*2 (or 116*e*3) and a plurality of second vertical connectors 116*f*2. The vertical connectors are embedded into the ceramic member 112*a*. The plurality of first vertical connectors 116*e*2 (or 116*e*3) vertically extend near a first vertical hole 112*b* (or 113*c*) so as to surround the first vertical hole 112*b* (or 113*c*) in a plan view. In an exemplary embodiment, a distance between the first vertical connector 116*e*2 (or 116*e*3) and the first vertical hole 112*b* (or 113*c*) is 0.2 to 20 mm. In an exemplary embodiment, a distance between the first vertical connector 116*e*2 (or 116*e*3) and the first vertical hole 112*b* (or 113*c*) is 2 to 5 mm. Each first vertical connector 116*e*2 (or 116*e*3) electrically connects the first central bias electrode layer 116*a* and the second central bias electrode layer 116*c*. The plurality of second vertical connectors 116*f*2 vertically extend near the second vertical hole 112*c* to surround the second vertical hole 112*c* on the plan view. Each second vertical connector 116*f*2 electrically connects the first annular bias electrode layer 116*b* and the second annular bias electrode layer 116*d*. The bias generator 32*a* is electrically connected to the second annular bias electrode layer 116*d*. That is, the first and second central bias electrode layers 116*a* and 116*c* are electrically connected to the bias generator 32*a* via the first and second annular bias electrode layers 116*b* and 116*d*. Further, the second central bias electrode layer 116*c* may be electrically connected to the bias generator 32*a* not via the first and second annular bias electrode layers 116*b* and 116*d*.

In an exemplary embodiment, the first annular bias electrode layer 116*b* is electrically connected to the second central bias electrode layer 116*c* via at least one third vertical connector 116*e*1 which extends in the vertical direction. The third vertical connector 116*e*1 electrically connects the first central bias electrode layer 116*a*, the second central bias electrode layer 116*c*, and the first annular bias electrode layer 116*b*. In an exemplary embodiment, the substrate support 11 includes at least one central heater electrode layer 117*a* embedded into the ceramic member 112*a* and disposed below the substrate support surface 110*a*. At least one central heater electrode layer 117*a* is disposed at a location lower than the first annular bias electrode layer 116*b* and higher than the second annular bias electrode layer 116*d*. In an exemplary embodiment, the substrate support 11 includes at least one annular heater electrode layer 117*b* embedded into the ceramic member 112*a* and disposed below the ring support surface 110*b*. At least one annular heater electrode layer 117*b* is disposed at a location lower than the first annular bias electrode layer 116*b* and higher than the second annular bias electrode layer 116*d*.

In an exemplary embodiment, the substrate support 11 includes a first electrode layer 116*a*, a second electrode layer 116*c*, and a plurality of vertical connectors 116*e*2 (or 116*e*3), which are embedded into the vertical member 112*a*. The second electrode layer 116*c* is disposed below the first electrode layer 116*a*. A plurality of vertical connectors 116*e*2 (or 116*e*3) vertically extend near the vertical hole 112*b* (or 113*c*) so as to surround the vertical hole 112*b* (or 113*c*) in a plan view. Each vertical connector 116*e*2 (or 116*e*3) electrically connects the first electrode layer 116*a* and the second electrode layer 116*c*. At least one power supply is electrically connected to the second electrode layer 116*c*. In an exemplary embodiment, at least one power supply 30 includes at least one of the RF power supply 31 and the DC power supply 32. In an exemplary embodiment, at least one power supply 30 includes both the RF power supply 31 and the DC power supply 32. The first electrode layer 116*a* and the second electrode layer. 116*c* may serve as the electrostatic electrode, the bias electrode, the RF electrode, or a combination thereof. Further, the DC signal generated by the DC power supply 32 may have a predetermined voltage level and have a sequence of pulses. In the latter case, the DC signal includes a plurality of first states and a plurality of second states in an alternate aspect. The DC signal has a first voltage level in a first state and has a second voltage level different from the first voltage level in a second state.

In an exemplary embodiment, the substrate support 11 includes first third circular bias electrode layers 116*a*, 116*c*, and 216*b*, a plurality of first vertical connectors 116*e*2 (or 116*e*3), the annular bias electrode layer 116*d*, and a plurality of second vertical connectors 116*f*2. The bias electrode layers, first vertical connectors, annular bias electrode layer, and second vertical connectors are embedded into the ceramic member 112*a*. The first and second circular bias electrode layers 116*a* and 116*c* include the first and second circular bias electrode layers 116*a* and 116*c* disposed below the electrostatic electrode layer 115*a*. The second circular bias electrode layer 116*c* is disposed below the first circular bias electrode layer 116*a*. A plurality of first vertical connectors 116*e*2 for 116*te*3) vertically extend in a vicinity of the first vertical hole 112*b* (or 113*c*) so as to surround the first vertical hole 112*b* (or 113*c*) in a plan view. Each first vertical connector 116*e*2 electrically connects the first circular bias electrode layer 116*a* and the second circular bias electrode layer 116*c*. A third circular bias electrode layer 216*b* is disposed below the second circular bias electrode layer 116*c*. A central area R1 of the third circular bias electrode layer 216*b* is overlapped with the second bias circular bias electrode layer 116*c* in the vertical direction, and an outer area R2 of the third circular bias electrode layer 216*b* is overlapped with the ring support surface 110*b* in the vertical direction. That is, the third circular bias electrode layer 216*b* has an outer diameter larger than the outer diameter of the second circular bias electrode layer 116*c*. The third circular bias electrode layer 216*b* is electrically connected to the second circular bias electrode layer 116*c* via the vertical connector 116*e*1. The annular bias electrode layer 116*d* is disposed below the third circular bias electrode layer 216*b*. A plurality of second vertical connectors 116*f*2 vertically extend in a vicinity of the second vertical hole 112*c* so as to surround the second vertical hole 112*c* in a plan view. Each second vertical connector 116*f*2 electrically connects the third circular bias electrode layer 216*b* and the annular bias electrode layer 116*d*.

Hereinabove, various exemplary embodiments have been described, but the present disclosure is not limited to the exemplary embodiment, but various additions, omissions, substitutions, and changes may be made. Further, it is possible to form another exemplary embodiment by combining elements in different exemplary embodiments.

Figure 7:
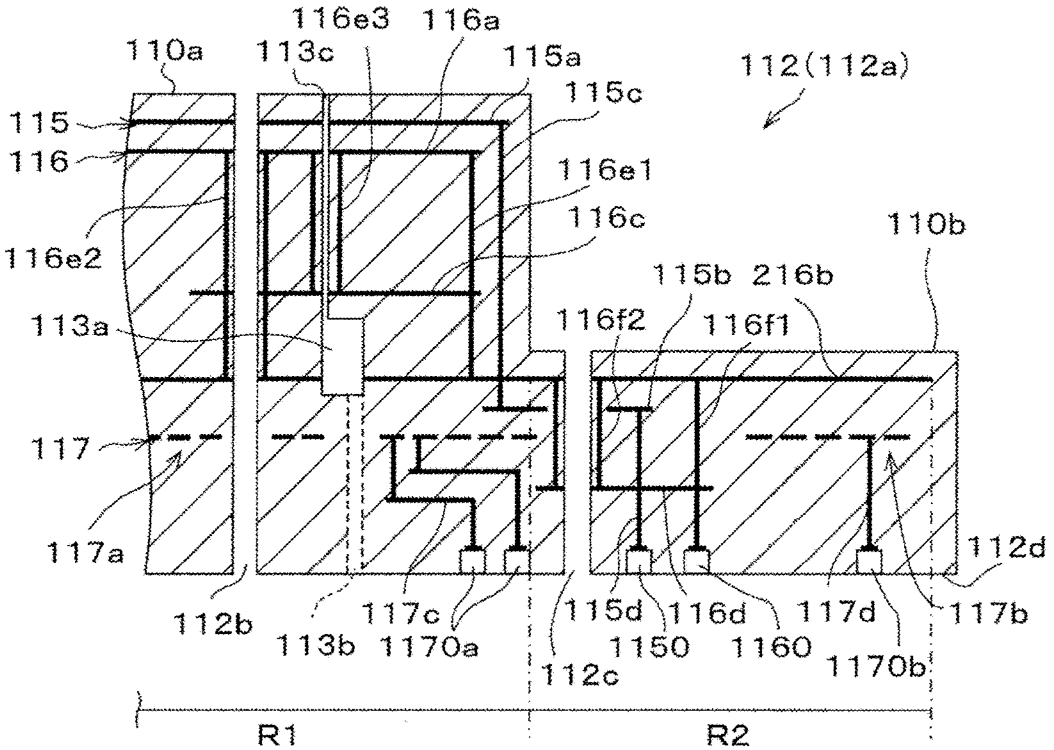
FIG. 7 is a cross-sectional view illustrating another configuration example of the electrostatic chuck.

For example, in the bias electrode 116 according to the exemplary embodiment, an approximately annular second bias electrode 116*b* is disposed below the annular area 110*b*, but as illustrated in FIG. 7, the second bias electrode 216*b* may be formed in an approximately disk shape having a larger diameter than the first bias electrode 116*a*. In this case, the second bias electrode 216*b* may be electrically further connected to the first conductive via 116*e*2 disposed on the periphery of the through hole 112*b*.

Further, for example, in the exemplary embodiment, the case where the heater electrode 117 includes the first heater electrode group 117*a* for heating the substrate W and the second heater electrode 117*b* for heating the ring assembly 120 is provided has been described as an example. However, when it is not necessary to control the temperature of the ring assembly 120, an appropriate annular second heater electrode 117*b* may be omitted.

<Activity Effect of Plasma Processing Apparatus According to Present Disclosure>

An inside of a tunnel structure (vertical hole: the through holes 112*b* and 112*c*, and the gas outlet 113*c* in the exemplary embodiment) formed inside the electrostatic chuck becomes a gas space which is in communication with the plasma processing space 10*s*. In other words, in particular, when the thickness of the electrostatic chuck 112 is large, the electric field space inside the ceramic member 112*a* increases (see FIG. 1). As a result, in the related art, in particular, when the thickness of the electrostatic chuck 112 is large, the potential difference in the vertical direction occurs by acceleration of ions inside the tunnel structure, which causes the abnormal discharge.

At this point, according to the plasma processing apparatus 1 according to the exemplary embodiment, the conductive via of the bias electrode 116 is disposed in the vertical direction along the vertical hole formed inside the electrostatic chuck 112. Therefore, the bias signal is supplied to the bias electrode 116 to keep the inside (in particular, vertical direction) of the vertical hole in the equivalent potential, and suppress the acceleration of the ions inside the vertical hole. In other words, the potential difference inside the vertical hole is suppressed to appropriately suppress the occurrence of the abnormal discharge inside the vertical hole.

Further, according to the exemplary embodiment, even when the thickness of the ceramic member 112*a* of the electrostatic chuck 112 is increased by arranging the conductive via in the vertical direction along the vertical hole as such, the occurrence of the abnormal discharge may be appropriately suppressed. In other words, since the thickness of the ceramic member 112*a* may be increased while suppressing the occurrence of the abnormal discharge, it is easy to arrange the heater electrode 117 inside the ceramic member 112*a* and mechanical characteristics of the electrostatic chuck 122 may be enhanced.

Further, according to the exemplary embodiment, since the occurrence of the abnormal discharge may be suppressed only by arranging the conductive via (bias electrode 116) in the vertical direction along the vertical hole as such, it is not necessary to separately arrange a member for a discharge measure inside (outside) the electrostatic chuck 112. As a result, workability or maintenance may be enhanced by comparing with the case of separately arranging the member for the discharge measure, and cost may be reduced.

Further, since the ceramic member 112*a* having the conductive via (bias electrode 116) according to the exemplary embodiment may realize the above structure by electrode printing inside the ceramic member 1123, the ceramic member 112*a* is excellent even in terms of cost performance in comparison with the related art.

Further, in the above exemplary embodiment, the heat transfer gas supply 113 is disposed only below the central area 110*a* (substrate support surface), but the heat transfer gas supply 113 may be further disposed below the annular area 110*b* (ring support surface). In other words, the heat transfer gas supply 113 may be configured to further supply heat transfer gas (back side gas: e.g., He gas) between the back side of the ring assembly 120 and the annular area 110*b* (ring support surface).

Figure 8:
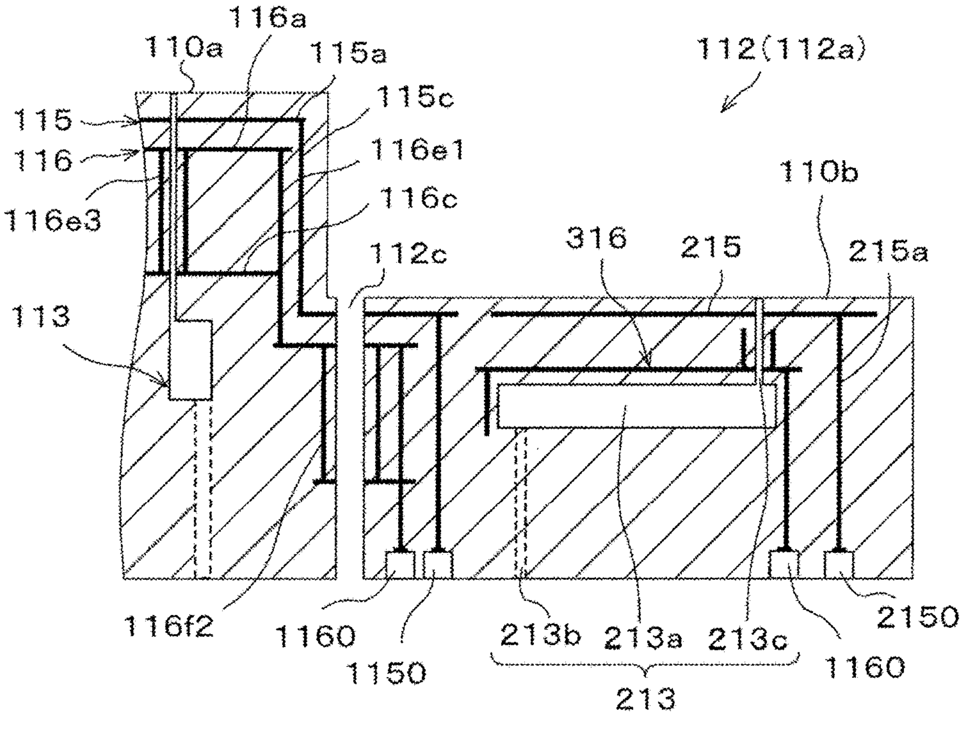
FIG. 8 is a cross-sectional view of a key part illustrating another configuration example of the electrostatic chuck.

FIG. 8 illustrates a configuration example of another heat transfer gas supply 213 for supplying heat transfer gas between the back side of the ring assembly 120 and the annular area 110*b* (ring support surface), which are arranged below the annular area 110*b*.

The heat transfer gas supply 213 has a distribution space 213*a*, a gas inlet 213*b* for supplying the heat transfer gas to the distribution space 213*a*, and a gas outlet 213*c* for discharging the heat transfer gas from the distribution space 213*a*. The gas inlet 213*b* is connected to a heat transfer gas supply source (not illustrated). The heat transfer gas from the heat transfer gas supply source is supplied between the back side of the ring assembly 120 and the annular area 110*b* via the gas inlet 213*b*, the distribution space 213*a*, and the gas outlet 213*c* in this order.

In addition, even when the heat transfer gas supply 213 is formed below the annular area 110*b* as such, a bias electrode 316 (conductive via) which extends in the vertical direction is arranged to at least surround the periphery of the heat transfer gas supply 213 in the diameter direction as illustrated in FIG. 8. Therefore, the space having the equivalent potential is formed in the area surrounded by the bias electrode 316 (conductive via) to suppress the potential difference in the thickness direction of the ceramic member 112*a*.

Further, when the tunnel structure (the distribution space 213*a* in the example illustrated in FIG. 8) is formed to extend in a plane direction (horizontal direction) of the ceramic member 112*a*, the bias electrode 316 may be further disposed along the upper surface of the tunnel structure as illustrated even in FIG. 8.

As described above, in the exemplary embodiment, the conductive member of the base 111 may serve as the lower electrode similarly to the bias electrodes 116 and 316. In other words, the bias signal from the power supply 30 is supplied to the base 111. As a result, the bias electrode 316 is at least disposed along the upper surface of the distribution space 213*a* forming the tunnel structure to form the space having the equivalent potential in the area surrounded by the base 111 and the bias electrode 316.

Further, in the above exemplary embodiment, the electrostatic electrode 115 is disposed only below the central area 110*a* (substrate support surface), but the electrostatic electrode 115 may be further disposed below the annular area 110*b* (ring support surface). In other words, another electrostatic electrode for adsorbing and holding the ring assembly 120 on the ring support surface may be further disposed.

Specifically, as illustrated in FIG. 8, the electrostatic electrode 115 may be provided below the annular area 110*b*, and may include an approximately annular second electrostatic electrode 215 for adsorbing and holding the ring assembly 120 on the annular area 110*b*. The second electrostatic electrode 215 is connected to a terminal 2150 via one or more conductive vias 215*a* which are approximately uniformly arranged in the circumferential direction. The adsorption power supply is electrically connected to the terminal 2150.

Further, only one second electrostatic electrode 215 may be disposed below the annular area 110*b* as illustrated in FIG. 8, and although not illustrated, a plurality of second electrostatic electrodes 215 may be arranged in the diameter direction below the annular area 110*b*. When a plurality of second electrostatic electrodes 215 are arranged, conductive vias 215*a* and terminals 2150 are arranged to correspond to the number of second electrostatic electrodes 215.

Further, as the adsorption power supply connected to the second electrostatic electrode 215, the power supply 30 illustrated in FIG. 3 may be used and an adsorption power supply (not illustrated) independent from the power supply 30 may be used. Further, the first electrostatic electrode 115*a* and the second electrostatic electrode 215 may be connected to independent adsorption power supplies, respectively, and connected to the same adsorption power supply.

Further, in the exemplary embodiment, the first conductive via 116*e* of the bias electrode 116 is installed up to a height location of the first bias electrode 116*a* in the thickness direction of the electrostatic chuck 112 (see FIG. 4). However, in terms of approximately suppressing the occurrence of the abnormal discharge inside the vertical hole, the first conductive via 116*e* is preferably arranged to stretch up to a proximity of an available plasma processing space 10*s*, i.e., a proximity of the substrate support surface (central area 110*a*) inside the electrostatic chuck 112. In other words, a distance between an upper end portion of the first conductive via 116*e* and the substrate support surface (central area 110*a*) is preferably as small as possible.

Figure 9:
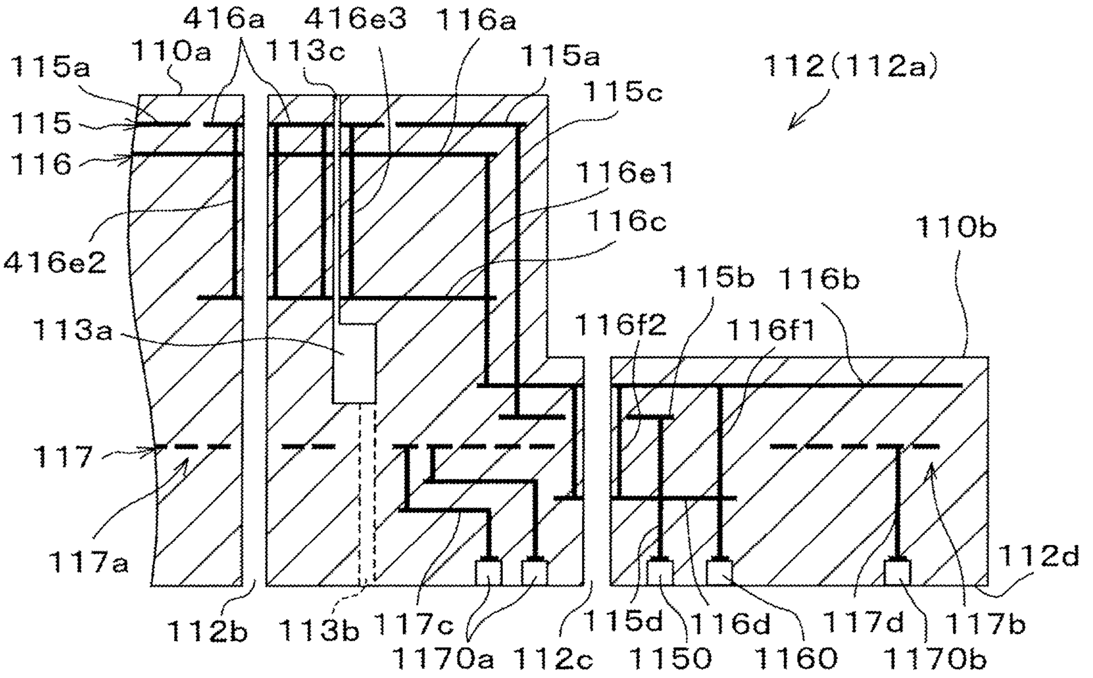
FIG. 9 is a cross-sectional view illustrating another configuration example of the electronic chuck.

By considering such a point, in the substrate support 11 according to the technique of the present disclosure, first conductive vias 416*e*2 and 416*e*3 for forming the space having the equivalent potential inside the vertical hole may be installed to stretch up to the height location of the first electrostatic electrode 115*a* as illustrated in FIG. 9. Further, in this case, an approximately dish-shaped additional bias electrode 416*a* is disposed at upper end portions of the first conductive vias 416*e*2 and 416*e*3 which stretch up to the height location of the first electrostatic electrode 115*a*. That is, the additional bias electrode 416*a* is electrically connected to the first bias electrode 116*a* via the first conductive vias 416*e*2 and 416*e*3. Further, an additional central bias electrode 416*a* is at the same height as the first electrostatic electrode 115*a*, and is electrically separated from the first electrostatic electrode 115*a*.

By the substrate support 11 according to the technique of the present disclosure, the first conductive vias 416*e*2 and 416*e*3 forming the space having the equivalent potential inside the through hole 112*b* and the gas outlet 113*c* inside the vertical hole (the through hole 112*b* and the gas outlet 13*c* in the illustrated example) the vertical hole as such are provided up to the height location of the first electrostatic electrode 115*a* closer to the substrate support surface (central area 110*a*) to suppress the occurrence of the abnormal discharge inside the vertical hole even very approximately.

Here, as illustrated in FIG. 9, when the first conductive vias 416*e*2 and 416*e*3 are provided up to the height location of the first electrostatic electrode 115*a* on the peripheries of both the through hole 112*b* as the vertical hole, an effective area of the first electrostatic electrode 115*a* is reduced on the plan view by installing the first conductive vias 416*e*2 and 416*e*3 or the additional bias electrode 416*a*.

In addition, when the effective area of the first electrostatic electrode 115*a* is reduced, the substrate W may not be approximately supported on the substrate support surface, and a desired plasma processing result may not be obtained with respect to the substrate W.

Figure 10:
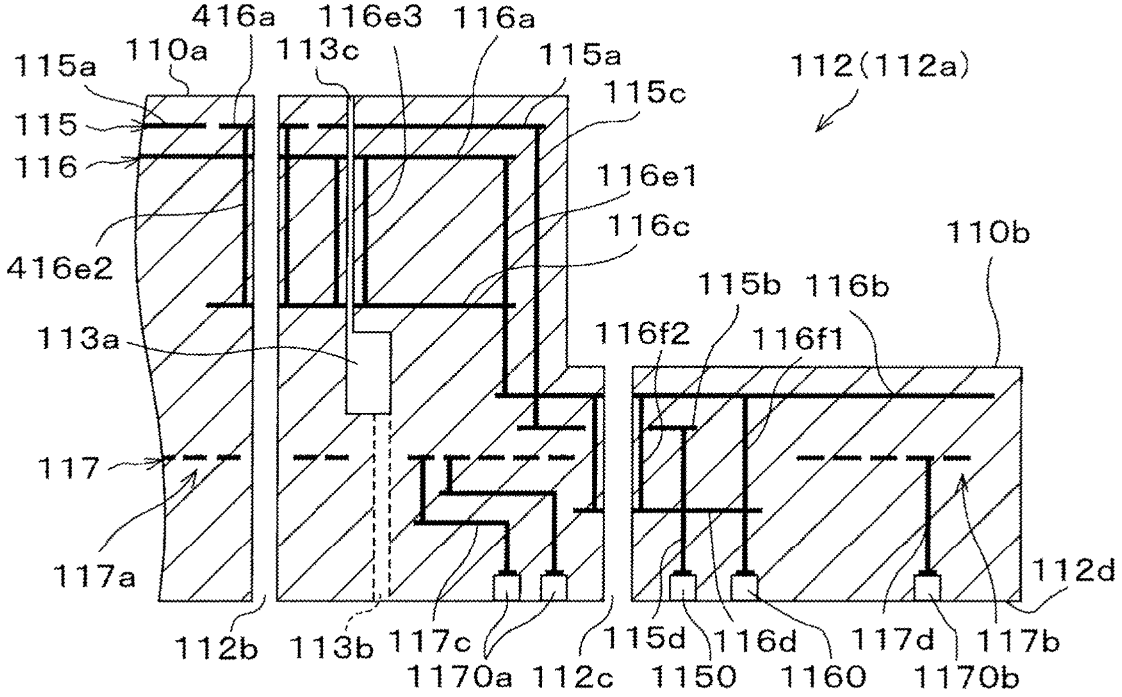
FIG. 10 is a cross-sectional view illustrating another configuration example of the electrostatic chuck.

Therefore, when the first conductive via 416*e* is installed to stretch up to the height location of the first electrostatic electrode 115*a* as such, the first conductive via 416*e*2 up to the height location of the first electrostatic electrode 115*a* may be disposed only on the periphery of a vertical hole having a large hole diameter, specifically, for example, the through hole 112*b* for inserting the substrate lifter pin, in which an occurrence risk of the abnormal discharge is comparatively large, as illustrated in FIG. 10.

As such, by arranging the first conductive via 416*e*2 and the additional bias electrode 416*a* only on the periphery of the through hole 112*b* of the substrate lifter pin on the substrate support surface, the effective area of the first electrostatic electrode 115*a* is minimally reduced and the potential difference of the vertical space of the through hole 112*b* is decreases to suppress the abnormal discharge.

Further, in the illustrated example, the upper end portions of the first conductive vias 416*e*2 and 416*e*3, and the additional bias electrode 416*a* are installed at the height location of the first electrostatic electrode 115*a*, but installation heights thereof are not limited to the height location of the first electrostatic electrode 115*a*. That is, when the upper end portions of the first conductive vias 416*e*2 and 416*e*3, and the additional bias electrode 416*a* may be at least arranged above (on the substrate support surface) the first bias electrode 116*a*, the occurrence risk of the abnormal discharge may be reduced inside the vertical hole as compared with the exemplary embodiment illustrated in FIG. 4.

Further, it should be considered that the disclosed exemplary embodiment is an example and is not limited in all aspects. Further, the exemplary embodiment may be omitted, substituted, and changed as various forms without departing from the appended claims and the spirit.

Further, the following configuration example also belongs to the technical scope of the present disclosure.

(1) A plasma processing apparatus comprising:

a plasma processing chamber;

a substrate support disposed in the plasma processing chamber, the substrate support including:

a base;

a ceramic member disposed on the base, and having a substrate support surface and a ring support surface, the ceramic member having a plurality of first vertical holes and a plurality of second vertical holes, each first vertical hole vertically extending downward from the substrate support surface, each second vertical hole vertically extending downward from the ring support surface;

at least one annular member disposed on the ring support surface to surround a substrate on the substrate support surface;

an electrostatic electrode layer embedded into the ceramic member and disposed below the substrate support surface;

first and second central bias electrode layers embedded into the ceramic member and disposed below the electrostatic electrode layer, the second central bias electrode layer being disposed below the first central bias electrode layer;

a plurality of first vertical connectors embedded into the ceramic member, and vertically extending in a vicinity of the first vertical hole so as to surround the first vertical hole in a plan view, each first vertical connector electrically connecting the first central bias electrode layer and the second central bias electrode layer;

first and second annular bias electrode layers embedded into the ceramic member, and disposed below the ring support surface, the first annular bias electrode layer being electrically connected to the second central bias electrode layer, the second annular bias electrode layer being disposed below the first annular bias electrode layer; and a plurality of second vertical connectors embedded into the ceramic member, and vertically extending in a vicinity of the second vertical hole so as to surround the second vertical hole in a plan view, each second vertical connector electrically connecting the first annular bias electrode layer and the second annular bias electrode layer, and a bias generator electrically connected to the second annular bias electrode layer and configured to generate a bias signal.

(2) The plasma processing apparatus of (1), wherein a distance between the first vertical connector and the first vertical hole is 0.2 to 20 mm.

(3) The plasma processing apparatus of (1), wherein a distance between the second annular bias electrode layer and a lower surface of the ceramic member is 1.5 mm or less.

(4) The plasma processing apparatus of (1), wherein the first annular bias electrode layer is electrically connected to the second central bias electrode layer via at least one third vertical connector vertically extending.

(5) The plasma processing apparatus of (4), wherein the third vertical connector electrically connects the first central bias electrode layer, the second central bias electrode layer, and the first annular bias electrode layer.

(6) The plasma processing apparatus of any one of (1) to (5), wherein the plurality of first vertical connectors and the plurality of second vertical connectors have a plurality of wire members uniformly arranged so as to surround a peripheral surface of the first vertical hole or the second vertical hole, respectively.

(7) The plasma processing apparatus of any one of (1) to (5), wherein the plurality of first vertical connectors and the plurality of second vertical connectors have a plurality of arc-shaped members uniformly arranged so as to surround a peripheral surface of the first vertical hole or the second vertical hole, respectively.

(8) The plasma processing apparatus of any one of (1) to (5), wherein the plurality of first vertical connectors and the plurality of second vertical connectors have a cylindrical shape configured to surround a peripheral surface of the first vertical hole or the second vertical hole, respectively.

(9) The plasma processing apparatus of any one of (1) to (8), wherein the substrate support surface is at a higher location than the ring support surface, and the first annular bias electrode layer is disposed at a lower location than the second central bias electrode layer.

(10) The plasma processing apparatus of (9), wherein the substrate support includes at least one central heater electrode layer embedded into the ceramic member and disposed below the substrate support surface, and the at least one central heater electrode layer is disposed at a location lower than the first annular bias electrode layer and higher than the second annular bias electrode layer.

(11) The plasma processing apparatus of (9) or (10), wherein the substrate support includes at least one annular heater electrode layer embedded into the ceramic member and disposed below the ring support surface, and the at least one annular heater electrode layer is disposed at a location lower than the first annular bias electrode layer and higher than the second annular bias electrode layer.

(12) The plasma processing apparatus of any one of (1) to (11), wherein the plurality of first vertical holes extend from the substrate support surface to a lower surface of the ceramic member.

(13) The plasma processing apparatus of any one of (1) to (12), wherein the ceramic member has: a gas distribution space formed at a location lower than the second central bias electrode layer; and a gas inlet extending from a lower surface of the ceramic member to the gas distribution space, wherein the plurality of first vertical holes extend from the substrate support surface to the gas distribution space.

(14) The plasma processing apparatus of any one of (1) to (13), wherein the bias generator is configured to generate a bias RF signal having a frequency of 1.2 MHz or less.

(15) The plasma processing apparatus of any one of (1) to (13), wherein the bias generator is configured to generate a bias RF signal having a frequency in a range of 100 to 500 kHz.

(16) The plasma processing apparatus of any one of (1) to (13), wherein the bias generator is configured to generate a DC based voltage pulse.

(17) The plasma processing apparatus of any one of (1) to (16), further comprising: an additional central bias electrode layer embedded into the ceramic member and disposed above the first central bias electrode layer, wherein the additional central bias electrode layer is electrically connected to the first central bias electrode layer via the first vertical connector.

(18) The plasma processing apparatus of (17), wherein the additional central bias electrode layer is at the same height as the electrostatic electrode layer, and is electrically separated from the electrostatic electrode layer.

(19) A plasma processing apparatus comprising:

a plasma processing chamber;

a substrate support disposed in the plasma processing chamber, the substrate support including:

a base;

a ceramic member disposed on the base and having a substrate support surface, the ceramic member having a plurality of vertical holes vertically extending downward from the substrate support surface;

an electrostatic electrode layer embedded into the ceramic member and disposed below the substrate support surface;

first and second bias electrode layers embedded into the ceramic member and disposed below the electrostatic electrode layer, the second bias electrode layer being disposed below the first bias electrode layer; and a plurality of vertical connectors embedded into the ceramic member, and vertically extending in a vicinity of the vertical hole so as to surround the vertical hole in a plan view, each vertical connector electrically connecting the first bias electrode layer and the second bias electrode layer, and a bias generator electrically connected to the second bias electrode layer and configured to generate a bias signal.

(20) A plasma processing apparatus comprising:

a plasma processing chamber;

a substrate support disposed in the plasma processing chamber, the substrate support including:

a base;

a ceramic member disposed on the base and having a substrate support surface, the ceramic member having a plurality of vertical holes vertically extending downward from the substrate support surface;

a first electrode layer embedded into the ceramic member;

a second electrode layer embedded into the ceramic member and disposed below the first electrode layer; and a plurality of vertical connectors embedded into the ceramic member, and vertically extending in a vicinity of the vertical hole so as to surround the vertical hole in a plan view, each vertical connector electrically connecting the first electrode layer and the second electrode layer, and at least one power supply electrically connected to the second electrode layer.

The invention claimed is:

1. A plasma processing apparatus comprising:

a plasma processing chamber;

a substrate support disposed in the plasma processing chamber, the substrate support including:

a base;

a ceramic member disposed on the base, and having a substrate support surface and a ring support surface, the ceramic member having a plurality of first vertical holes and a plurality of second vertical holes, each first vertical hole vertically extending downward from the substrate support surface, each second vertical hole vertically extending downward from the ring support surface;

at least one annular member disposed on the ring support surface so as to surround a substrate on the substrate support surface;

an electrostatic electrode layer embedded into the ceramic member and disposed below the substrate support surface;

first and second central bias electrode layers embedded into the ceramic member and disposed below the electrostatic electrode layer, the second central bias electrode layer being disposed below the first central bias electrode layer;

a plurality of first vertical connectors embedded into the ceramic member, and vertically extending in a vicinity of the first vertical hole so as to surround the first vertical hole in a plan view, each first vertical connector electrically connecting the first central bias electrode layer and the second central bias electrode layer;

first and second annular bias electrode layers embedded into the ceramic member, and disposed below the ring support surface, the first annular bias electrode layer being electrically connected to the second central bias electrode layer, the second annular bias electrode layer being disposed below the first annular bias electrode layer; and a plurality of second vertical connectors embedded into the ceramic member, and vertically extending in a vicinity of the second vertical hole so as to surround the second vertical hole in a plan view, each second vertical connector electrically connecting the first annular bias electrode layer and the second annular bias electrode layer, and a bias generator electrically connected to the second annular bias electrode layer and configured to generate a bias signal.

2. The plasma processing apparatus of claim 1, wherein a distance between the first vertical connector and the first vertical hole is 0.2 to 20 mm.

3. The plasma processing apparatus of claim 1, wherein a distance between the second annular bias electrode layer and a lower surface of the ceramic member is 1.5 mm or less.

4. The plasma processing apparatus of claim 1, wherein the first annular bias electrode layer is electrically connected to the second central bias electrode layer via at least one third vertical connector vertically extending.

5. The plasma processing apparatus of claim 4, wherein the third vertical connector electrically connects the first central bias electrode layer, the second central bias electrode layer, and the first annular bias electrode layer.

6. The plasma processing apparatus of claim 1, wherein the plurality of first vertical connectors or the plurality of second vertical connectors have a plurality of wires uniformly arranged so as to surround a peripheral surface of the first vertical hole or the second vertical hole, respectively.

7. The plasma processing apparatus of claim 1, wherein the plurality of first vertical connectors or the plurality of second vertical connectors have a plurality of arc-shaped members uniformly arranged so as to surround a peripheral surface of the first vertical hole or the second vertical hole, respectively.

8. The plasma processing apparatus of claim 1, wherein the plurality of first vertical connectors or the plurality of second vertical connectors have a cylindrical shape configured to surround a peripheral surface of the first vertical hole or the second vertical hole, respectively.

9. The plasma processing apparatus of claim 1, wherein the substrate support surface is at a higher location than the ring support surface, and the first annular bias electrode layer is disposed at a lower location than the second central bias electrode layer.

10. The plasma processing apparatus of claim 9, wherein the substrate support includes at least one central heater electrode layer embedded into the ceramic member and disposed below the substrate support surface, and the at least one central heater electrode layer is disposed at a location lower than the first annular bias electrode layer and higher than the second annular bias electrode layer.

11. The plasma processing apparatus of claim 9, wherein the substrate support includes at least one annular heater electrode layer embedded into the ceramic member and disposed below the ring support surface, and the at least one annular heater electrode layer is disposed at a location lower than the first annular bias electrode layer and higher than the second annular bias electrode layer.

12. The plasma processing apparatus of claim 1, wherein the plurality of first vertical holes extend from the substrate support surface to a lower surface of the ceramic member.

13. The plasma processing apparatus of claim 1, wherein the ceramic member has:

a gas distribution space formed at a location lower than the second central bias electrode layer; and a gas inlet extending from a lower surface of the ceramic member to the gas distribution space, wherein the plurality of first vertical holes extend from the substrate support surface to the gas distribution space.

14. The plasma processing apparatus of claim 1, wherein the bias generator is configured to generate a bias RF signal having a frequency of 1.2 MHz or less.

15. The plasma processing apparatus of claim 1, wherein the bias generator is configured to generate a bias RF signal having a frequency in a range of 100 to 500 KHz.

16. The plasma processing apparatus of claim 1, wherein the bias generator is configured to generate a DC based voltage pulse.

17. The plasma processing apparatus of claim 1, further comprising:

an additional central bias electrode layer embedded into the ceramic member and disposed above the first central bias electrode layer, wherein the additional central bias electrode layer is electrically connected to the first central bias electrode layer via the first vertical connector.

18. The plasma processing apparatus of claim 17, wherein the additional central bias electrode layer is at the same height as the electrostatic electrode layer, and is electrically separated from the electrostatic electrode layer.

* * * * *